US007009447B2

(12) United States Patent  
Korol

(10) Patent No.: US 7,009,447 B2
(45) Date of Patent: Mar. 7, 2006

(54) OUTPHASING MODULATOR

(75) Inventor: Victor Korol, Petach Tikva (IL)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 10/720,671

(22) Filed: Nov. 25, 2003

(65) Prior Publication Data

US 2005/0110590 A1    May 26, 2005

(51) Int. Cl.
 H03G 1/00    (2006.01)
 H03G 9/00    (2006.01)
(52) U.S. Cl. .................. 330/10; 330/107; 330/149; 330/52; 332/144
(58) Field of Classification Search ............... 332/144, 332/145; 330/10, 107, 124 R, 295, 84, 124 D, 330/149, 52, 151
 See application file for complete search history.

(56) References Cited

U.S. PATENT DOCUMENTS 3,170,127 A * 2/1965 Cramer ................. 332/151
5,365,187 A * 11/1994 Hornak et al. ............ 330/10
5,901,346 A    5/1999 Stengel et al.
5,990,734 A    11/1999 Wright et al.
6,690,233 B1 * 2/2004 Sander .................. 330/124 R
2005/0110590 A1 * 5/2005 Korol ..................... 332/149

FOREIGN PATENT DOCUMENTS

WO    WO 03/047093    6/2003

OTHER PUBLICATIONS

IEEE Standard Dictionary of Electrical and Electronics Terms Third Edition Dec. 13, 1984 p. 169.*
Bo Shi et al., "An IF CMOS signal component separator chip for LINC transmitters", Proceedings of the IEEE 2001 custom integrated circuits conference, San Diego, CA, USA, May 6-9, 2001, IEEE, US, vol. CONF. 23, May 6, 2001, pp. 49-52.
Copy of PCT Search Report for PCT/US2004/036332, mailed Mar. 11, 2005.

* cited by examiner

Primary Examiner—Michael B Shingleton
(74) Attorney, Agent, or Firm—Pearl Cohen Zedek Latzer, LLP

(57) ABSTRACT

Briefly, an apparatus having an outphasing modulator that may provide at least first and second outphased signals to a power amplifier. The outphasing modulator may control amplitude of the first and second outphased signals by an amplitude modulation controller which may vary an amplitude level of first and second control signals base on a desired output power level of said power amplifier.

20 Claims, 3 Drawing Sheets

OUTPHASING MODULATOR

BACKGROUND OF THE INVENTION

Outphasing transmitters may be used in stations of wireless communication systems such as, for example, base stations, mobile stations of a cellular communication system and/or mobile units and access points of a wireless local area network (WLAN) and/or other types of wireless communication systems, if desired.

Outphasing techniques may combine two nonlinear radio frequency (RF) power amplifiers (PA's) into a linear power amplifier system. The two PA's may be driven with amplitude modulated (AM) signals, phase modulated (PM) signals and/or amplitude and phase modulated signals. The amplitude and/or phase modulated signals may be provided by an outphasing modulator to the linear power amplifier system.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following detailed description when read with the accompanied drawings in which:

Figure 1:
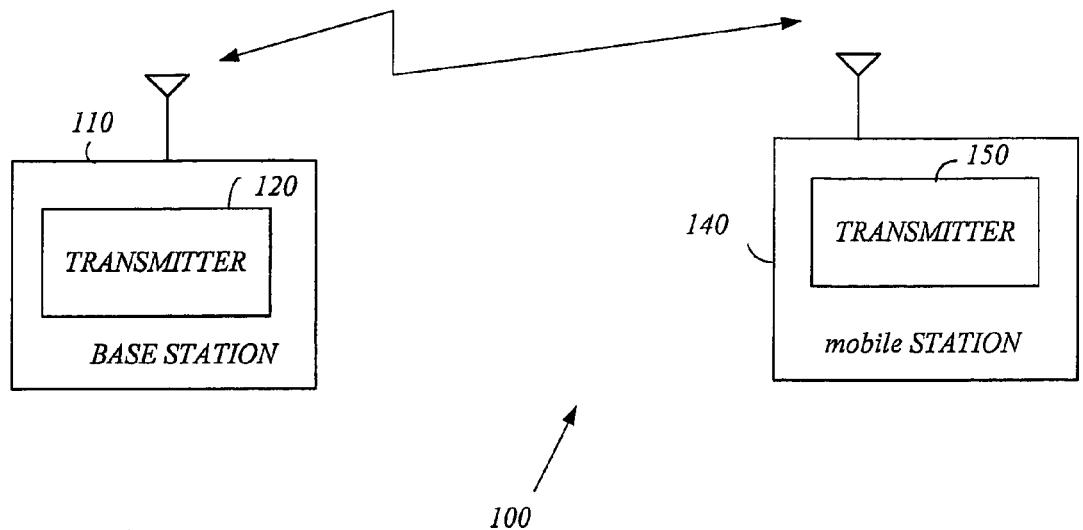
FIG. 1 is a schematic illustration of a wireless communication system according to an exemplary embodiment of the present invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those of ordinary skill in the art that the present invention may be practiced without these specific details. In other instances, well-known methods, procedures, components and circuits have not been described in detail so as not to obscure the present invention.

Some portions of the detailed description, which follow, are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

It should be understood that the present invention may be used in a variety of applications. Although the present invention is not limited in this respect, the circuits and techniques disclosed herein may be used in many apparatuses such as transmitters of a radio system. Transmitters intended to be included within the scope of the present invention include, by a way of example only, cellular radiotelephone transmitters, two-way radio transmitters, digital system transmitters, wireless local area network transmitters, wideband transmitters, ultra wideband transmitters, and the like.

Types of cellular radiotelephone transmitters intended to be within the scope of the present invention may include, but are not limited to, Code Division Multiple Access (CDMA), CDMA-2000 and wide band CDMA (WCDMA) cellular radiotelephone transmitters for receiving spread spectrum signals, transmitters for global system for mobile communication (GSM), transmitters for third generation cellular systems (3G), orthogonal frequency division multiplexing (OFDM) transmitters, and the like.

Turning first to FIG. 1, a schematic illustration of a wireless communication system 100 according to an exemplary embodiment of the present invention is shown. Although the scope of the present invention is not limited to this example, wireless communication system 100 may include at least one base station 110 and at least one mobile station 140. In some embodiments of the invention, base station 110 may include a transmitter 120 and mobile station 140 may include a transmitter 150. At least one of transmitters 120 and 150 may be an outphasing transmitter with reactive termination. For example, the reactive termination may be implemented in the form of a line coupler with shunt resistance, although the scope of the present invention is in no way limited in this respect.

Although the scope of the present invention is not limited in this respect, base station 100 may request the mobile station to transmit at a desired power level. In some embodiments of the present invention the desired power level may depend, for example, on the distance of mobile station 140 from base station 110. For example, base station 110 may request to increase the output power if mobile station 140 is far from the base station 110 and to decrease the output power of mobile station 140 close to base station 110. In other embodiments of the present invention, the desired power level may be determined according to a standard of wireless communication system 100. The desired power level may vary from standard to standard and/or from system to system.

Although the scope of the present invention is not limited in this respect, in some embodiments of the present invention, wireless communication system 100 may be a cellular communication system. Thus, base station 110 and mobile station 140 may include a base station and a mobile station, respectively, of a cellular communication system. In other embodiments of the present invention, wireless communication system 100 may be a WLAN communication system. In such embodiments, base station 110 may be an access point (AP) and mobile station 140 may be a mobile unit such as, for example, a laptop computer, a tablet computer, a handheld device, and the like.

Figure 2:
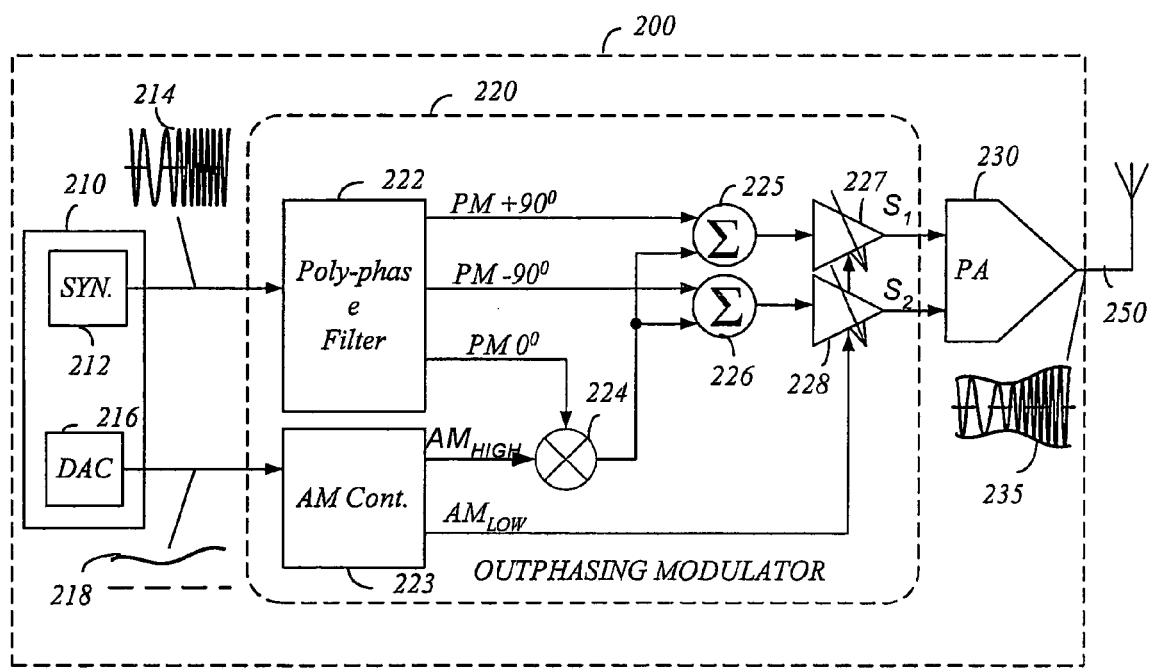
FIG. 2 is a block diagram of an outphasing transmitter according to an exemplary embodiment of the present invention.

Turning to FIG. 2, a block diagram of an outphasing transmitter 200 according to an exemplary embodiment of the present invention is shown. Although the scope of the present invention is not limited in this respect, in some embodiments of the present invention, outphasing transmitter 200 may include a modulator 210, an outphasing modulator 220, a power amplifier (PA) unit 230, which may include one or more power amplifiers, as described below, and at least one antenna 250.

Although the scope of the present invention is not limited in this respect, modulator 210 may be included in a polar transmitter and may provide to outphasing modulator 220 a phase modulated (PM) signal 214 and an analog signal 218, which may be an envelope of an amplitude modulated (AM) signal. In some embodiments of the present invention, modulator 210 may include a synthesizer (SYN.) 212 and a digital to analog converter (DAC) 216. For example, SYN. 212 may modulate a phase of an RF signal (not shown) and may generate PM signal 214. DAC 216 may receive an AM signal, which may be converted into a digital signal (not shown). In some embodiments of the invention, DAC 216 may convert the digital signal to provide analog signal 218, which may be the envelope of the AM signal.

Although the scope of the present invention is not limited in this respect, outphasing modulator 220 may include a poly-phase filter 222, an AM controller (CONT.) 223, a mixer 224, combiners 225 and 226, and variable gain amplifiers (VGAs) 227 and 228. Although the scope of the present invention is not limited in this respect, poly-phase filter 222 may receive PM signal 214 and may modify the phase of PM signal 214, for example, by +90° and/or −90° and/or by 0°. In some embodiments of the present invention, poly-phase filter 222 may provide a PM+90° signal to combiner 225, a PM−90° signal to combiner 226 and a PM+0° signal to mixer 224.

Although the scope of the present invention is not limited in this respect, mixer 224 may provide an in-phase AM modulated signal to combiners 225, 226, as described below. In embodiments of the invention, AM controller 223 may use an $AM_{HIGH}$ control signal to control the modulation performed by mixer 224. A modulation method applied by mixer 224 may be determined by the amplitude of the $AM_{HIGH}$ control signal, if desired. In this exemplary embodiment, combiners 225, 226 may provide outphased signals to VGAs 227, 228, respectively. AM controller 223 may vary the gain of VGAs 227, 228 with an $AM_{LOW}$ control signal. In some embodiments of the present invention, the amplitude of the $AM_{LOW}$ control signal may be determined according to the desired output power of PA unit 230.

Although the scope of the present invention is not limited in this respect, outphasing modulator 220 may provide at least two outphasing signals, e.g., S1 and S2, to PA unit 230. An envelope and/or phase of an RF signal 235 may correspond to the pair of complex conjugate outphasing signals S1 and S2, which may be input to PA unit 230, if desired. A position of outphasing signals S1 and S2 on a complex plane may be referred to herein as an outphasing route. In some embodiments, at least one outphasing route may be determined based on the efficiency of components of PA unit 230 and/or optimization criteria, e.g., a linearity optimization process. For example, the outphasing route may be generated by outphasing modulator 220. AM signal 218 and PM signal 214 of modulator 210 may be used to change the modulation of modulator 220 according to the desired outphasing route.

Although the scope of the present invention is not limited in this respect, in some exemplary embodiments, PA unit 230 may include at least two power amplifiers and a combiner with reactive termination. In embodiments of the present invention, PA unit 230 may amplify and combine the outphasing signals S1 and S2 to provide RF signal 235 to antenna 250.

Although the scope of the present invention is not limited in this respect, types of antennas that may be used for antenna 250 may include an internal antenna, a dipole antenna, an omni-directional antenna, a monopole antenna, an end fed antenna, a circularly polarized antenna, a microstrip antenna, a diversity antenna, and the like.

Figure 3:
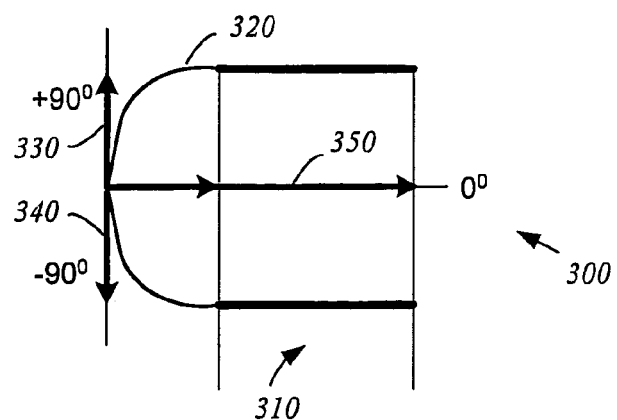
FIGS. 3, 4 and 5 are schematic illustrations of three, respective, examples of modulated signals in a complex plane, helpful in demonstrating the operation of an outphasing modulator according to exemplary embodiments of the present invention.
Figure 4:
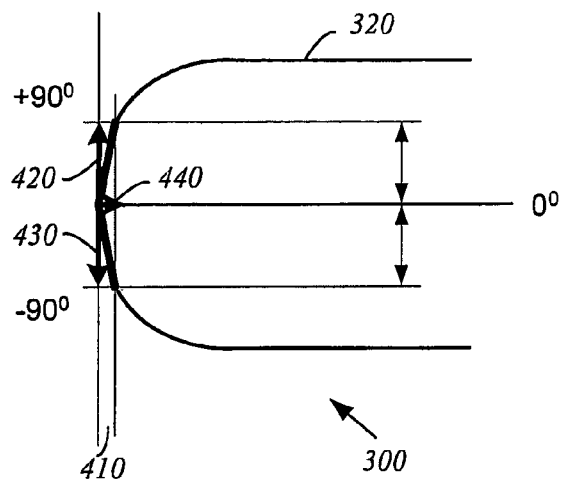
Figure 5:
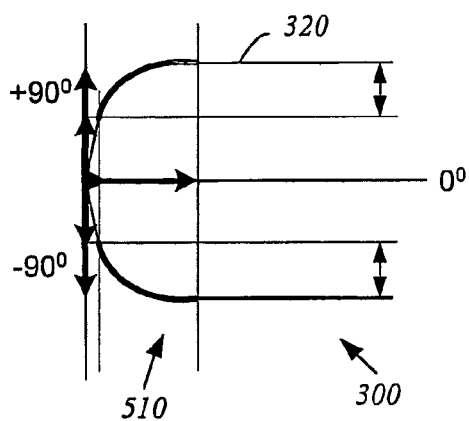
Figure 6:
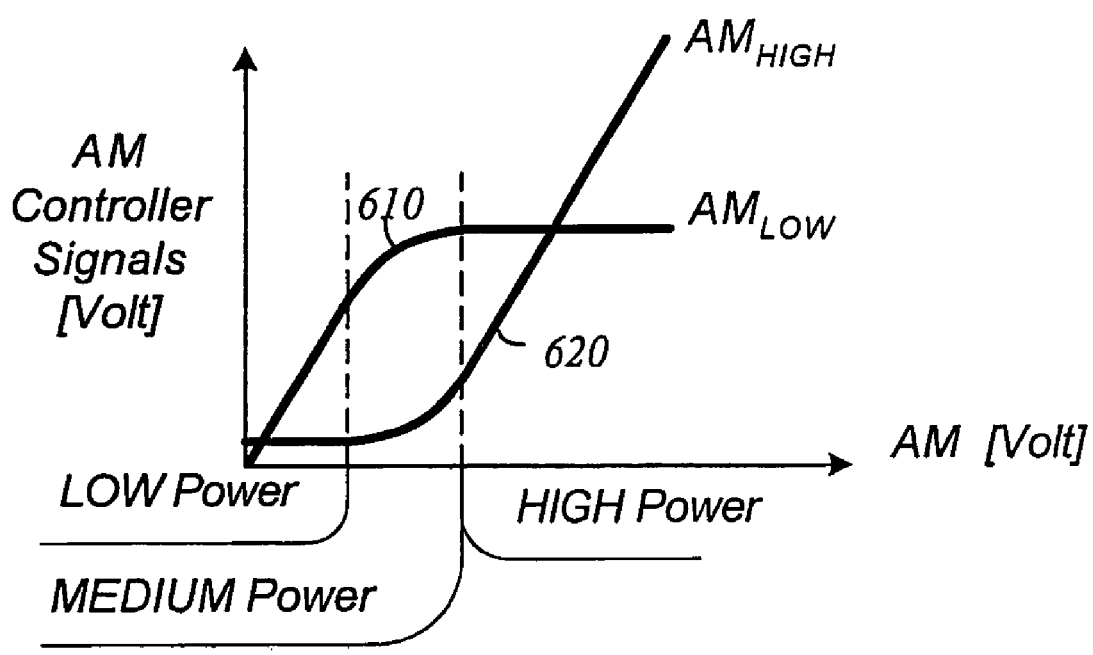
FIG. 6 is a schematic illustration of control signals helpful in demonstrating the operation of an outphasing modulator according to exemplary embodiments of the present invention.

The operation of outphasing modulator 220 will now be described in detail with reference to FIGS. 3, 4, 5, and 6. FIGS. 3, 4, and 5 are schematic illustrations of three, respective examples of modulated signals in a complex plane 300 that may be helpful in demonstrating the operation of outphasing modulator 220, according to exemplary embodiments of the present invention. FIG. 6 is a schematic illustration of control signals of AM controller 223 as a function of AM signal 218, helpful in demonstrating the operation of outphasing modulator 220, according to exemplary embodiments of the present invention.

Although the scope of the present invention is not limited in this respect, outphasing modulator 220 may use different methods to synthesize RF signal 235 according to the position of RF signal 235 on complex plane 300, for example, the positions depicted by FIGS. 3, 4, 5. In some embodiments of the invention, the amplitude of RF signal 235 may be controlled by adjusting the position of outphasing signals S1 and S2 on an outphasing route 320.

In some embodiments of the present invention, AM controller 223 may receive analog signal 218 and may provide at least two control signals $AM_{HIGH}$ 620 and $AM_{LOW}$ 610, as depicted schematically in FIG. 6, which may be used to modulate the outphasing signals. Exemplary embodiments of the present invention, at least three different modulation methods may be used. The modulation methods may be selected according to the position of the RF signal on complex plane 300 and/or according to the AM level of the outphasing signals. In some embodiments, complex plane 300 may be divided into three regions such as, for example, a high power region 310 (shown in FIG. 3), a low power region 410 (shown in FIG. 4) and intermediate power region 510, (shown in FIG. 5).

Turning first to the modulation method that may be used for high power region 310, although the scope of the present invention is not limited in this respect, high power region 310 of the outphasing route may include constant quadrature components such as, for example the PM+90° signal and the PM−90° signal. High power region 310 may be composed of a vector sum of fixed amplitude quadrature components 330, 340, and modulated in-phase component 350. AM controller 223 may output, for example, a constant $AM_{LOW}$ signal 610 and a non-constant $AM_{HIGH}$ signal 620, as indicated by a "HIGH Power" region in FIG. 6. In this modulation mode, mixer 224 may modulate PM+0° signal according to the level of the $AM_{HIGH}$ signal and the gain of VGAs 227, 228 may remain constant.

Turning to the modulation method that may be used for low power region 410, although the scope of the present invention is not limited in this respect, low power region 410 may be characterized by the linear behavior of quadrature (Q) components 420, 430 and an in-phase (I) component 440. In this modulation mode, the $AM_{LOW}$ control signal 610 may vary the gain of VGAs 227, 228, and the $AM_{HIGH}$ control signal 620 may remain constant, as is shown by a "LOW Power" region in FIG. 6. Thus, in this exemplary modulation method, mixer 224 may not modulate the PM+0° signal. Combiners 225, 226 may apply constant signals PM+90°, PM−90° and a scaled PM+0° signal to VGAs 227, 228, respectively.

Turning to the modulation method that may be used for intermediate power region 510, although the scope of the present invention is not limited in this respect, intermediate power region 510, may lie in the transition regions of the outphasing signals. For this exemplary modulation method, AM controller 223 may vary, substantially simultaneously, the levels of $AM_{HIGH}$ control signal 620 and $AM_{LOW}$ control signal 610, as indicated by a "MEDIUM Power" region in FIG. 6. In some embodiments, as power is reducing, mixer 224 may reach its minimum modulation amplitude and VGAs 227, 228 may be turned on. For example, mixer 224 may modulate PM+0° signal according to the voltage level of the $AM_{HIGH}$ control signal 620, and the gain of VGAs 227, 228 may be varied according to the voltage level of the $AM_{LOW}$ control signal 610, if desired.

While certain features of the invention have been illustrated and described herein, many modifications, substitutions, changes, and equivalents will now occur to those skilled in the art. It is, therefore, to be understood that the appended claims are intended to cover all such modifications, substitutions, changes, and equivalents as may fall within the true spirit of the invention.

What is claimed is:

1. An apparatus comprising:
    an outphasing modulator to provide at least first and second outphased signals to a power amplifier, wherein amplitudes of the first and second outphased signals are controlled, at least in part, by an amplitude modulation controller, which is able to vary an amplitude level of first and second control signals, respectively, according to a selected modulation method, and wherein the second control signal is able to control a variable gain amplifier of the outphasing modulator.

2. The apparatus of claim 1, wherein the first and second control signals modulate the first and second outphased signals, respectively, to provide a desired output power level of said power amplifier.

3. The apparatus of claim 1, wherein the selected modulation method is selected according to a position of the first and second outphasing signals on a complex plane.

4. The apparatus of claim 1, wherein the outphasing modulator comprises:
    a mixer to modulate a phase modulated signal according to the first control signal voltage level.

5. The apparatus of claim 4, wherein the outphasing modulator comprises:
    a poly-phase filter to generate at least first and second phase-shifted phase modulated signals and the phase modulated signal;
    a first combiner to combine the first phase-shifted signal and an amplitude modulated version of the phase modulated signal provided by the mixer; and
    a second combiner to combine the second phase-shifted signal and the amplitude modulated version of the phase modulated signal.

6. The apparatus of claim 1, wherein the variable gain amplifier comprises at least first and second variable gain amplifiers to amplify the first and second outphased signals, respectively.

7. A method comprising:
    selecting a modulation method from a set of two or more modulation methods based on a position of an outphasing signal on a complex plane, wherein the position of the outphasing signal is determined based on a desired output power level, and wherein selecting comprises selecting from the set of modulation methods a first modulation method for a first region of the complex plane, a second modulation method for a second region of the complex plane, and a third modulation method for a third region of the complex plane.

8. The method of claim 7, further comprising:
    generating the outphasing signal using the first modulation method by applying a first control signal to a mixer;
    generating the outphasing signal using the second modulation method by applying the first control signal to a mixer and a second control signal to a variable gain amplifier; and
    generating the outphasing signal using the third modulation method by applying the second control signal to the variable gain amplifier.

9. A wireless communication device comprising:
    a dipole antenna operably coupled to a power amplifier;
    an outphasing modulator to provide at least first and second outphased signals to the power amplifier, wherein amplitudes of the first and second outphased signals are controlled, at least in part, by an amplitude modulation controller, which is able to vary an amplitude level of first and second control signals, respectively, according to a selected modulation method, and wherein the second control signal is able to control a variable gain amplifier of the outphasing modulator.

10. The wireless communication device of claim 9, wherein the first and second control signals modulate the first and second outphased signals, respectively, to provide a desired output power level of said power amplifier.

11. The wireless communication device of claim 9, wherein the selected modulation method is selected according to a position of the first and second outphasing signals on a complex plane.

12. The wireless communication device of claim 9, wherein the outphasing modulator comprises:
    a mixer to modulate a phase modulated signal according to the first control signal voltage level.

13. The wireless communication device of claim 12, wherein the outphasing modulator comprises:
    a poly-phase filter to generate at least first and second phase-shifted phase modulated signals and the phase modulated signal;
    a first combiner to combine the first phase-shifted signal and an amplitude modulated version of the phase modulated signal provided by the mixer; and
    a second combiner to combine the second phase-shifted signal and the amplitude modulated version of the phase modulated signal.

14. The wireless communication device of claim 9, wherein the variable gain amplifier comprises at least first and second variable gain amplifiers to amplify the first and second outphased signals, respectively.

15. A wireless communication system comprising:
    a mobile station includes an outphasing modulator to provide at least first and second outphased signals to the power amplifier, wherein amplitudes of the first and second outphased signals are controlled, at least in part, by an amplitude modulation controller, which is able to vary an amplitude level of first and second control signals, respectively, according to a selected modulation method, and wherein the second control signal is able to control a variable gain amplifier of the outphasing modulator.

16. The wireless communication system of claim 15, wherein the first and second control signals modulate the first and second outphased signals, respectively, to provide a desired output power level of said power amplifier.

17. The wireless communication system of claim 15, wherein the selected modulation method is selected according to a position of the first and second outphasing signals on a complex plane.

18. The wireless communication system of claim 15, wherein the outphasing modulator comprises:
   a mixer to modulate a phase modulated signal according to the first control signal voltage level.

19. The wireless communication system of claim 18, wherein the outphasing modulator comprises:
   a poly-phase filter to generate at least first and second phase-shifted phase modulated signals and the phase modulated signal;
   a first combiner to combine the first phase-shifted signal and an amplitude modulated version of the phase modulated signal provided by the mixer; and
   a second combiner to combine the second phase-shifted signal and the amplitude modulated version of the phase modulated signal.

20. The wireless communication device of claim 15, wherein the variable gain amplifier comprises at least first and second variable gain amplifiers tom amplify the first and second outphased signals, respectively.

* * * * *